US006324117B1

United States Patent
Zink et al.

(12) United States Patent
(10) Patent No.: US 6,324,117 B1
(45) Date of Patent: Nov. 27, 2001

(54) METHOD OF SELECTING A MEMORY ACCESS LINE AND AN ACCESS LINE DECODER FOR PERFORMING THE SAME

(75) Inventors: Sébastien Zink, Aix-en-Provence; Bertrand Bertrand, Trets; David Naura, Aix-en-Provence, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/676,434

(22) Filed: Sep. 29, 2000

(30) Foreign Application Priority Data

Sep. 29, 1999 (FR) .................................................. 99 12148

(51) Int. Cl.$^7$ ...................................................... G11C 8/00
(52) U.S. Cl. ................. 365/230.06; 365/230.08; 365/189.11; 326/106
(58) Field of Search ................. 365/230.06, 230.08, 365/189.11, 221; 326/106, 108

(56) References Cited

U.S. PATENT DOCUMENTS 4,680,485   7/1987   Uhrey .
4,972,380   11/1990  Hidaka et al. .
6,181,635 * 1/2001   Bae ................................ 365/230.06

FOREIGN PATENT DOCUMENTS

60142438A * 7/1985 (JP) ................................ 365/230.06

OTHER PUBLICATIONS

French Search Report dated May 31, 2000 with Annex to French Application No. 99–12148.

* cited by examiner

Primary Examiner—David Nelms
Assistant Examiner—David Lam
(74) Attorney, Agent, or Firm—Lisa K. Jorgenson; Jon A. Gibbons; Fleit, Kain, Gibbons, Gutman & Bongini P.L.

(57) ABSTRACT

The invention proposes a method of selecting a determined access line of a serial access type integrated circuit memory, a determined access line being selectable among a determined group of access lines (AL0–AL7) of the same nature, for example a group of bit lines or a group of word lines, a line code on p bits being respectively associated to each access line of the group, which consists in pre-activating all the access lines of the group, then of deactivating progressively the other access lines as a function of the bits (Ai) of the line code of the access line to select received in series via the serial data input of the memory such that, in the end, only the access line to be selected remains activated.

21 Claims, 4 Drawing Sheets

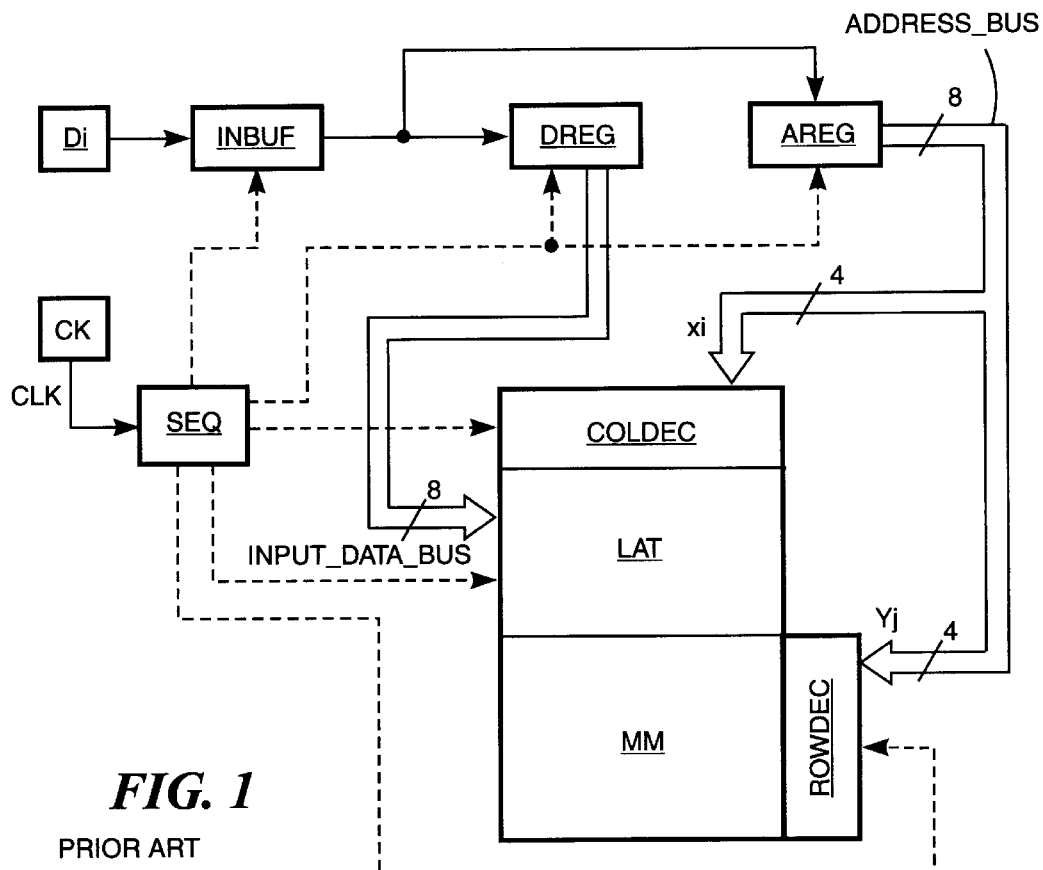
FIG. 1
PRIOR ART
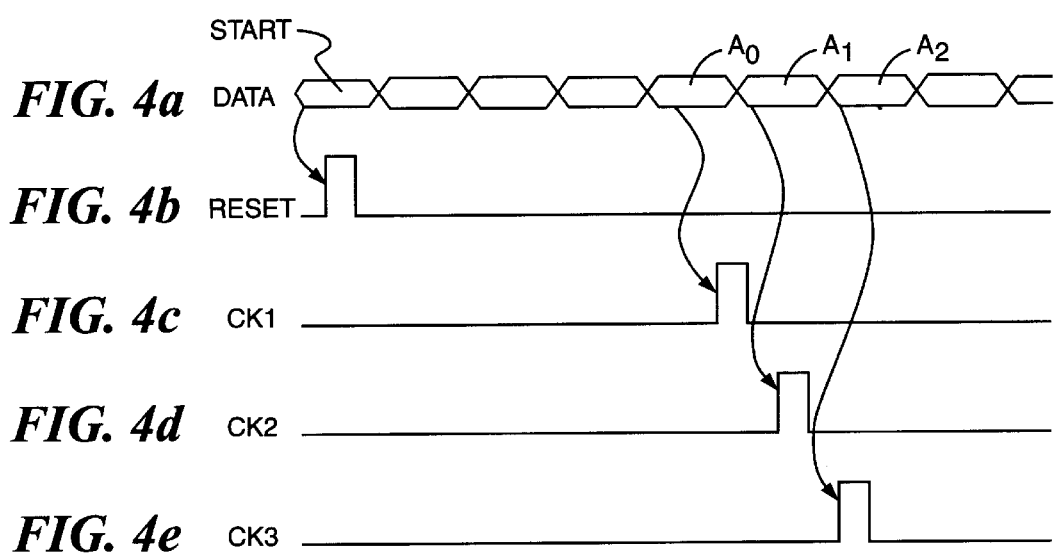

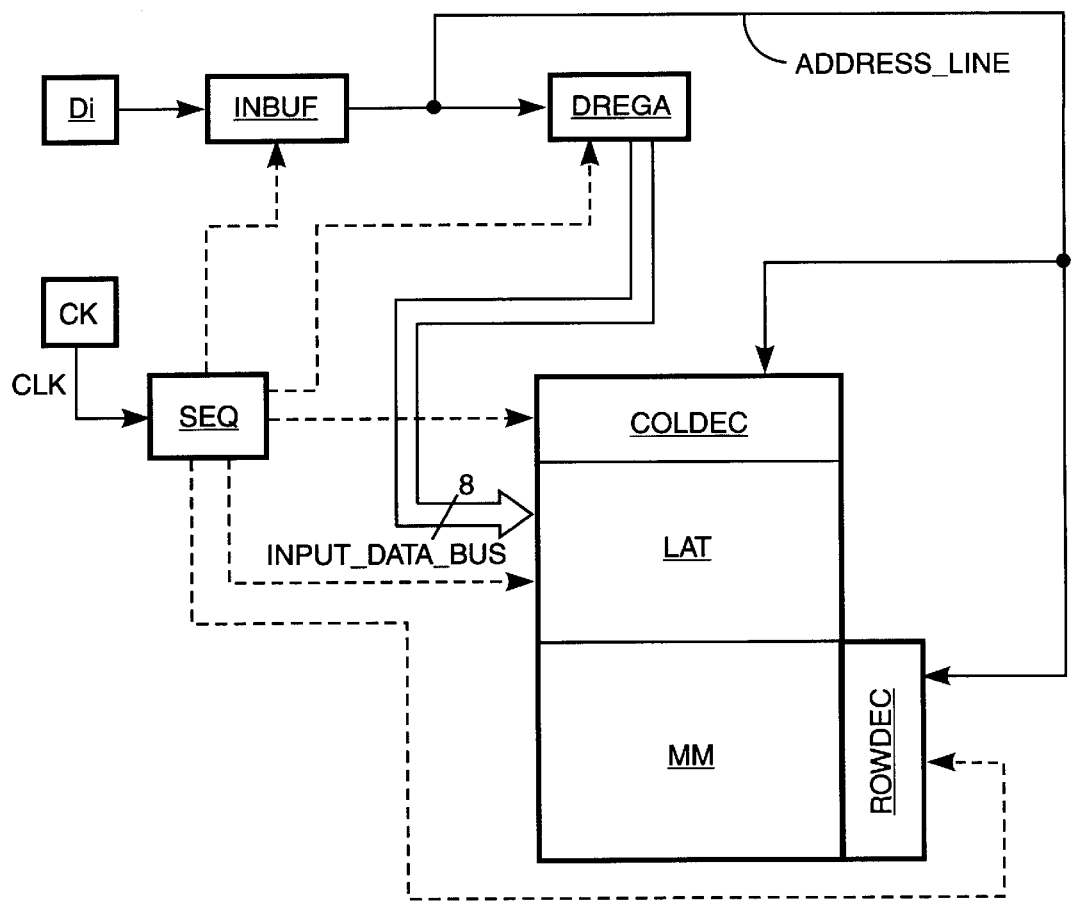
FIG. 5
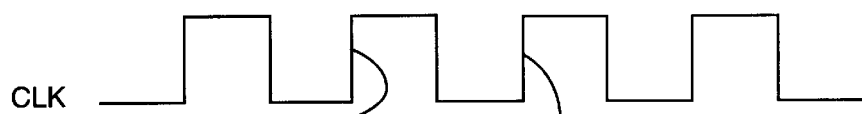
FIG. 7a  CLK
FIG. 7b  INCR1
FIG. 7c  INCR2

METHOD OF SELECTING A MEMORY ACCESS LINE AND AN ACCESS LINE DECODER FOR PERFORMING THE SAME

CROSS-REFERENCE TO RELATED APPLICATIONS

This application is based upon and claims priority from prior French Patent Application No. 99 12148, filed Sep. 29, 1999, the entire disclosure of which is herein incorporated by reference.

BACKGROUND OF THE INVENTION

1. Field of the Invention

The present invention broadly relates to the field of the integrated circuit memories, especially in EEPROM technology (electrically erasable and programmable read only memory) and more particularly the present invention related to address registers for addressing cells in serial access memories.

2. Description of Related Art

The architecture of a prior art serial access memory as known in the state of the art is shown schematically in FIG. 1.

The memory first of all comprises what is known as a memory space MM. The memory space is formed by a matrix of memory cells fabricated according to a given technology. A memory cell memorizes the value of one bit of the memory. The cells of a same column are connected to a same connection line, classically depicted vertically and referred to as the bit line. In addition, cells of a same line are connected to a same connection line, classically depicted horizontally and referred to as a word line. As uses herein through out the following sections, the term "word lines" and "bit lines" are designated by the generic expression "access line".

To access a cell (e.g., for a read or write operation) it is necessary to activate the bit line and the word line to which the cell is connected. The term "activate" is herein understood as the action of bringing the access line under consideration to a determined voltage potential (which is a function of the read or write operation to carry out). The action of activating a given one of the access lines belonging to a same group (of bit lines or word lines), and that one access line only, is herein referred to as "selecting the access line." This access line selection is carried out by a decoder circuit, more simply known as a line access decoder. The memory thus comprises a word line decoder ROWDEC and a bit line decoder COLDEC.

The memory also comprises a set of column registers LAT cooperating with the bit line decoder to activate the bit lines.

For writing or reading a binary word in the memory, an instruction is received at a serial data input DI of the memory, according to a determined serial data transmission protocol (for example the I²C, SPI or MICROWIRE protocols). Since the binary data of the instruction are sent to the input DI in the form of an electrical signal, thee binary data is typically reshaped by an input buffer INBUF. It is important to note, that the INBUF circuit is not manditory and can be omitted in certain applications. In general, the following information is contained in the instruction: operation code (e.g.: writing or reading), a memory address designating a memory word, and, as the case arises, at least one word of data to be written (for a writing operation). A sequencer SEQ generates command signals for the proper operation of the memory during execution of a received instruction. The sequencer SEQ receives a clock signal CLK via a clock input CK of the memory. The command signals it generates are depicted by arrows in broken lines.

Thus, the data corresponding to the address of the memory word concerned by the operation are loaded in a shift register or an address register AREG under command of the sequencer SEQ. From there, an address bus ADDRES_BUS sends a first part $x_i$ of the memory word address, referred to as the column address, up to a bit line decoder COLDEC, and another part $y_j$ of the memory word address, referred to as the line address, up to a word decoder RODEC. In the example depicted in FIG. 1, the complete address of one memory word is coded on 8 bits whereupon the address bus ADDRESS_BUS comprises eight transmission lines. The address is then divided into two parts $x_i$ and $y_j$ each of four bits, whereupon the address bus ADDRESS_BUS splits into two parts each of four transmission lines. The address register AREG is then an 8-bit register, i.e., it comprises a plurality of memory latches (or flip-flops) in series, respectively for storing the eight consecutively received address bits. It provides the function of effecting a serial-to-parallel conversion of the flow of address bits received by the memory via input DI. To this end, an output of each of the eight latches of the register AREG is respectively connected to one of the eight transmission lines of the address bus ADDRESS_BUS.

Likewise, the instruction data corresponding to a word to be written (as the case arises) are loaded into an input shift register DREG under control of the sequencer SEQ. The register DREG is an 8-bit register, i.e. it comprises eight memory latches in series respectively for storing the eight consecutively received data bits. The shift register DREG provides a series-to-parallel conversion of the flow of data bits received by the memory via the serial data input DI. As a result, an output of each of the eight latches of register DREG is respectively connected to one of the eight transmission lines of a data input bus INPUT_DATA_BUS. Bus INPUT_DATA_BUS is moreover connected to the set column registers LAT to supply the latter with eight data bits in parallel form. These binary data are loaded into storage and switching latches of the column register associated with the memory word concerned, under control of sequencer SEQ.

One shortcoming of the prior art serial access memories is that the address register AREG takes up a lot of space on the doped silicon substrate on which the memory is formed. This is due to the large number of transistors that compose the memory. It is important to point out that the dope silcon area occupied by the shift register is penalizing in terms of fabrication cost, especially for low capacity memories storing only a few bytes.

Accordlying, a need exists for a method and a system and to overcome the shortcoming of the use of AREG address registers for address memory circuits.

SUMMARY OF THE INVENTION

Briefly, according to the present invention, a method of selecting a determined access line of an integrated circuit memory with serial access, such as a memory in EEPROM technology, a determined access line being selectable among a group of access lines of the same nature, for example a group of bit lines or a group of word lines, a line code on p bits being respectively associated to each access line of the group, the process comprising the following steps:

a) activating all the access lines of the group;
  b) receiving, via a serial data input of the memory, a bit of determined rank of the code of the access line to select;

c) and, as a function of the value of the bit received at the preceding step, deactivating a part of the other access lines, steps b) and c) being repeated p times successively, respectively for each of the bits of the line code received via the serial data input of the memory, such that at the end of these p iterations of steps b) and c), only the access line to be selected remains activated.

To select a given access line, the method according to the present invention thus consists of, at a first stage, "pre-activating" all the access lines of the group then, at a second stage, deactivating progressively the other access lines, as a function of the bits of the line code of the access line to select which are received in series through the memory's serial data input so that, in the end, only the access line to select remains active. This method eliminates the need for a shift register such as the address register AREG of FIG. 1. The invention makes it possible to make serial access memories occupying less area of the doped silicon substrate.

As explained above, since the selection of a memory access line is provided by an access line decoder, in another embodiment of the present invention a decoder for implementing a process such as defined above is disclosed.

In yet another embodiment, an integrated memory circuit, of the serial access type, such as those fabricated in EEPROM technology is disclosed. The memory comprises a serial data input and a memory space which comprises memory cells in the form of a matrix and accessible by a group of bit lines and a group of word lines, characterized in that it comprises a bit line decoder and/or a word line decoder described above.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention will be apparent from the following detailed description of the invention taken by way of entirely non-limiting example and illustrated by the attached drawings in which:

FIG. 1 is a diagram of a prior art serial access memory;

FIGS. 4a to 4e are timing charts of signals that come into play during the operation of the decoder shown in FIG. 3, according to the present invention;

FIG. 5 is a diagram of a serial access memory, according to the present invention;

FIGS. 7a to 7c are timing charts of signals corresponding to the diagram of FIG. 6, according to the present invention.

DETAILED DESCRIPTION OF PREFERRED EMBODIMENTS

Figure 2:
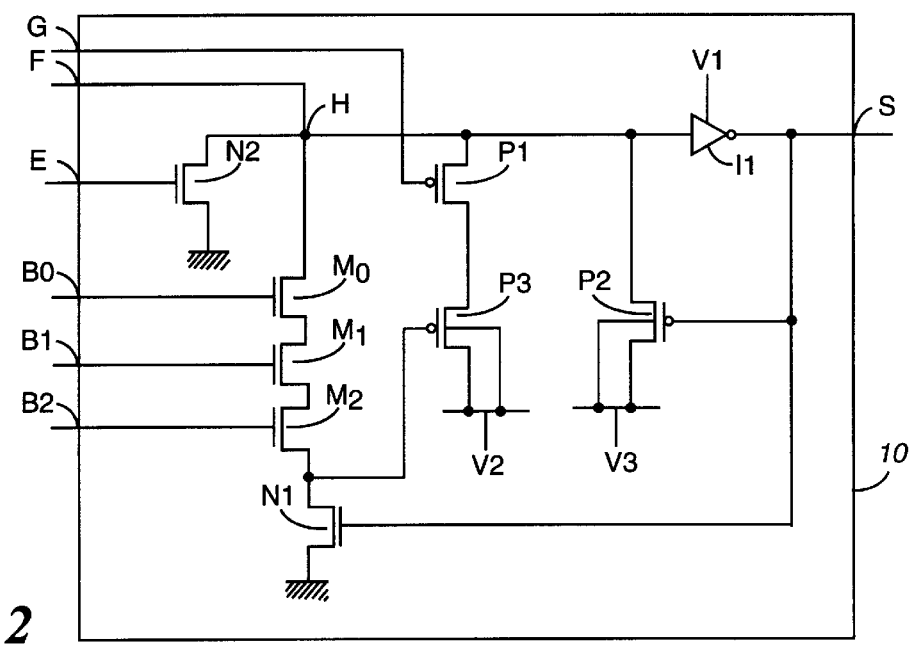
FIG. 2 is a diagram of a latch for a line access decoder, according to the present invention.

It is important to note that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawing like numerals refer to like parts through several views.

Refering now to FIG. 2, shown is a diagram of a latch for a line access decoder according to the present invention. A latch 10, such as flip-flop, comprises switching element comprising an inverter I1 connected by its input to an input node H and by its output to a latch output S. The output S is to be connected to a single given access line of the group of access lines concerned by the decoder. In the active state of the latch, the access line is activated. In the deactivated state of the latch, the access line is deactivated. An activated state of the latch is defined as the state in which in a non-zero voltage potential is imposed on the output S and thus on the access line to which that output is connected. Conversely, the deactivated state of the latch is defined as a state in which a zero voltage potential is imposed on the access line. In other terms, the inverter has the function of imposing the non-zero voltage potential or the zero voltage potential on the output S of the latch when the voltage potential at the input node H of the latch is respectively zero or non-zero.

The inverter I1 can for instance be a CMOS technology inverter, that is comprising a P-type MOS transistor and an N-type MOS transistor, the gates of which are commonly connected, mounted in series between a non-zero voltage potential V1 and a zero voltage potential formed by the ground of the integrated circuit. Under these conditions, the non-zero voltage potential referred to in the preceding paragraph is the voltage potential V1. Moreover, the memory comprises an element (not shown) to ensure that the voltage potential V1 is equal to a high programming voltage (with respect to ground) on the order of 18 volts, or the low supply voltage Vcc of the integrated circuit (with respect to ground), on the order of 5 volts, or yet another voltage potential depending on the current operation (readout, programming, or erasing).

The latch comprises stabilization element, to maintain the latch in the deactivated state despite the presence of leakage currents or other phenomena of the same nature. This stabilization element comprise a P-type MOS transistor identified by numeral P2 whose drain is connected to the input node H, its source to a positive voltage potential V3 and its gate to the output S. The transistor P2 connected in this way provides a loop for compensating possible leakage currents in order to maintain the latch in the deactivated state, on condition that other element do not put it in the activated state, unless otherwise activated by input node H. Naturally, these stabilization element operate only when there is no action on the part of other elements that have the effect of setting the latch into the active state. In other words, transistor P2 only fulfills its function of maintaining the latch in the deactivated state in the absence of action from these other inputs and elements. Accordingly, transistor P2 is highly resistive.

The latch also comprises activating elements for setting the latch into the active state, which oppose the above-mentioned stabilization element. This activation element comprise controlled switching element to impose a zero voltage potential at the input node H of the latch. This switch is e.g. controlled by an N-type MOS transistor referenced N2 having its drain connected to input node H, its source to ground, and its gate at an input E of the memory. In operation, this input E can receive an initialization signal RESET active at logic 1 to impose the zero voltage potential at the node H. Such a transistor indeed serves to activate the latch as a function of the reset signal RESET. As explained in further detail below, the access line decoder comprises a switching element for setting all the latches into the active state, preferably simultaneously. This switching element make it, e.g. possible to apply the above-mentioned reset signal RESET to the inputs E of all the latches of the decoder, such that all of these latches are simultaneously activated.

The latch also comprises deactivation element to set the latch into the inactive state. These deactivation element comprise decoding element which applies a zero voltage potential at the input node H of the latch as a function of a line code that is specific the access line and as a function of the selection signals received by the decoding element, cooperating with auxiliary element to impose a non-zero voltage potential on the input node H of the latch, which act when there is no action from the decoding element. In other words, the deactivation of the latch is obtained by the effect of these latter element, unless they are deprived of effect by the decoding element.

The coding element comprise, in series between the input node H and ground, p N-type MOS transistors where p is the number of bits encoding the line code of an access line. In an example where p is equal to 3, these transistors are referenced M0 to M2. The gates of transistors M0 to M2 are connected to selection inputs of the latches, denoted respectively B0 to B2, to each receive respectively one among three selection signals Bit0, Bit1, Bit2 or, respectively, Bit0 bar, Bit1 bar, Bit2 bar. These selection signals shall be discussed further. However, we note at this stage that it is the combination of the selection signals received on selection inputs B0 to B2 of the latch which determines the activation condition of the latch, i.e. which identifies the latch by the line code of the access line to which it is coupled. In series with transistors M0 to M2 between the input node H and ground, the decoding element also comprise another N-type MOS transistor referenced N1 whose gate is connected to the output S of the latch. The purpose of this transistor is to ensure that the decoding element only have effect when the latch is activated.

The element for imposing a non-zero voltage potential on the input node H of the latch comprise two P-type MOS transistors referenced P1 and P3 in series between the above input node H and a positive voltage V2. The gate of transistor P1 is connected to an input G of the latch to receive a signal DEC which is at logic zero by default such as to make transistor P1 conducting. The gate of transistor P3 is connected to the drain of transistor N1 so that it is at the ground's zero voltage potential when the latch is active, and so that it makes transistor P3 active in that state. The voltage V2 is for example equal to Vcc. It will be noted firstly that when the latch is active, and the signal DEC is at zero, transistors P1 and P3 tend to impose a non-zero voltage potential equal to V2 at the input node H. Secondly, it will be noted that when the latch is likewise activated (so that transistor N1 is conducting) but when, in addition, transistors M0 to M2 of the decoding element receive at their respective gates selection signals such as to make them conducting, the decoding element tend to impose the ground's zero voltage potential on the same input node H. To settle this conflict, transistors P1 and P3 are made highly resistive so that it is the decoding element which take over, whereby the voltage potential at input node H is the ground's zero voltage potential. A weak current between Vcc and ground flows in this case. In this way, transistors P1 and P3 can be considered to impose the non-zero voltage potential V2 at input node H only when the decoding element have no effect, that is when one of the transistors M0, M1, M2 or N1 is non conducting.

In the diagram of FIG. 2, a connection links the input node H to an output F of the latch which shall be discussed further. However, it can noted at this stage that due to the presence of the inverter Ii, the voltage potential at output F is the inverse of the voltage potential at output S.

Figure 3:
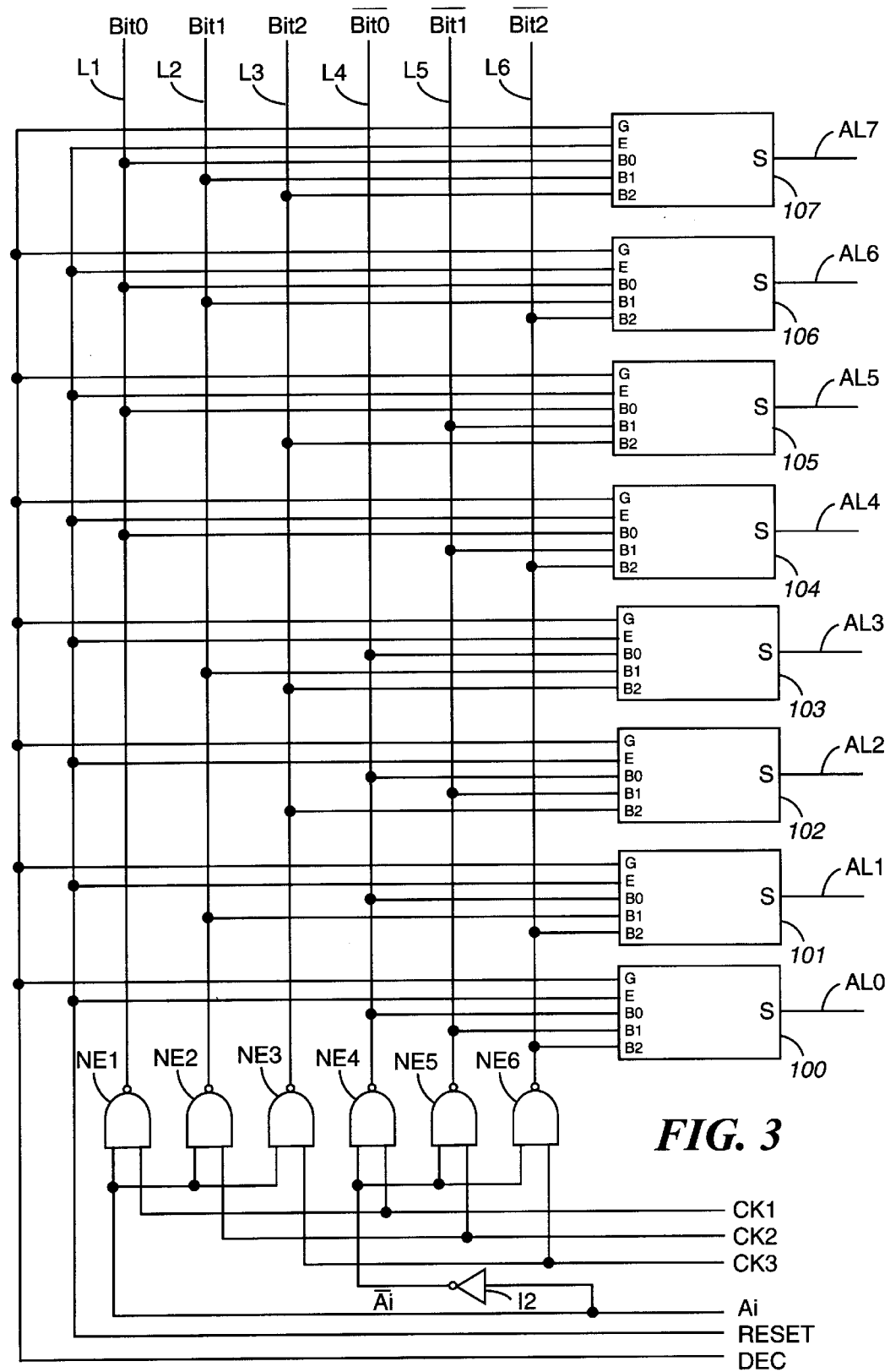
FIG. 3 is a diagram of a line access decoder using the latch of FIG. 2, for selecting one line among a group of eight access lines of the same nature, according to the present invention.

In FIG. 3 there is shown an access line decoder using the latch of FIG. 2, according to the present invention suitable for selecting one line among a group of eight access lines of the same nature. In this example, a three-bit line code is associated to each access line, i.e., p is equal to three. It is therefore necessary to process three address bits received via the memory's serial address input to select one of the access lines. These address bits are the bits of the line code of the line to select.

To this end, such a decoder comprises eight latches such as explained above with reference to FIG. 2, which are referenced 100 to 107. These latches are each coupled to an access line of a group of access lines of the same nature. More specifically, the outputs S of these latches are each connected to one among eight access lines, respectively AL0 to AL7. In the case of a bit line decoder, lines AL0 to AL7 are bit lines. In the case of a word line decoder, lines AL0 to AL7 are word lines.

The decoder also comprises a switching element for setting all the latches into the active state. This switching element preferably comprise connections to apply the above-mentioned reset signal RESET to the respective inputs E of all the latches. In this way, latches 100 to 107 can be simultaneously activated by the transition to logic 1 of the RESET signal.

The decoder also comprises connections for applying the above-mentioned signal DEC to the respective inputs G of all the latches.

The decoder comprises above all elements for generating the above-mentioned selection signals which are referenced bit0, bit1, bit2, bit0 bar, bit1 bar and bit2 bar in FIG. 3. These elements serve to generate the above-mentioned selection signal as a function of the bits of the line code of the access line to be selected received in series via the serial input DI of the memory.

These decoder elements comprise six NAND type logic gates referenced NE1 to NE6 whose outputs are connected to respective connection lines L1 to L6, and generate the selection signals, respectively bit0, bit1, bit2, bit0 bar, bit1 bar and bit2 bar.

A first input NE1 to NE3 receives a signal Ai which is none other than the current address bit received by the memory via its serial data input and, as the case arises, also via the input buffer circuit INBUF. The second respective inputs of the gates NE1 to NE3 receive a synchronization signal respectively CK1 to CK3. A first input of gates NE4 to NE6 receives a signal Ai bar which is the logic inverse of signal Ai, i.e. the inverse logic of the current address bit received by the memory. The bit Ai bar is obtained by logical inversion of bit Ai by an inverter I2. The second respective inputs of the gates NE4 to NE6 receive the synchronization signal CK1 to CK3. To express this in more general terms, and for line codes encoded on p bits, the elements for generating the selection signals bit0, bit1, bit2, bit0 bar, bit1 bar and bit2 bar comprise:

p NAND type logic gates which, together, receive at a first input successively the p bits of the received code line, and which each receive at a second input one among p synchronization signals presenting a pulse in phase respectively with the $p^{th}$ bit of the received code line;

p other NAND type logic gates which, together, receive at a first input, successively the inverse logic on the p bits of the received code line and which each receive at a second input one among p synchronization signals presenting a pulse in phase respectively with the $p^{th}$ bit of the received code line.

The shape of the synchronization signals CK1 to CK3 can be seen on the timing charts of FIGS. 4c to 4e respectively. These signals each present a pulse in phase with an address bit respectively A0 to A2 received via the memory's serial data input DI. The flow of bits DATA received at this input DI is represented symbolically on the timing chart of FIG. 4a. They are bits encoding an instruction. Note that synchronization signals such as signals CK1 to CK3 already exist in state-of-art memories. They are generated by the sequencer SEQ (FIG. 1) precisely to synchronize the operation of the memory, and in particular, but not only, its address register AREG. It is import to note that the present the invention therefore does not require the elements or means for generating these synchronization signal other than those already present in a memory of a known type.

The flow of bits DATA is received at the rate of the memory's clock signal CLK (not shown) i.e., it corresponds to the sampling of the electrical signal present at the memory's serial data input DI at the rate of that signal. It begins with a start bit denoted START in the timing chart of FIG. 4a. This START bit implies the transition to 1 of the RESET signal shown on the timing chart of FIG. 4b, as depicted schematically by a logical implication arrow. In one example the RESET signal remains at 1 at the most during one clock period. The three bits of the DATA flow which, in one example, are received between the START bit and the first address bit A0, correspond for example to the code of the operation to be carried out in the memory, namely: readout, writing, or other. The following bits A0 to A2 are the bits of the line access code to select and are for example comprised in the address of a memory word of the memory space on which the operation is to be carried out. In the case of a write operation, the flow of bits DATA further comprises bits encoding one or several data to written. The structure of the flow of DATA bits depends on the serial transmission protocol recognized by the memory.

Reception of bit A0, then A1 and A2 implies the synchronization signal pulse respectively CK1, CK2 and CK3, shown in FIGS. 4c to 4e respectively. The pulses correspond to a transition to 1 of the synchronization signal concerned for at the most one period of the clock signal.

Returning to FIG. 3, the following shall be noted as regards the connection of the elements for generating selection signals at the selection inputs B0 to B2 of the latches:

input B0 of latches 100 to 103 is connected to line L4 while that of latches 104 to 107 is connected to line L1;

input B1 of latches 100, 102, 104, 105 is connected to line L5 whereas that of latches 101, 103, 106 and 107 is connected to line L2;

input B2 of latches 100, 101, 104 and 106 is connected to line L6 whereas that of latches 102, 103, 105 and 107 is connected to line L3.

In this manner, it can be verified that the respective decoding element of latches 100 to 107 cooperate with the decoder's selection signal generating element in a one-to-one relationship. The above connections thus allow to individualize the latches, and thus the access lines to which they are coupled, by a three-bit code which is none other than the code known as the line code.

The operation of the decoder implementing the method of the invention shall now be described with reference, as necessary, to the diagrams of FIGS. 2 and 3, and to the timing charts of FIGS. 4a to 4e.

The selection of a given access line among a group of access lines of the same nature—a line on p bits being respectively associated to each access line of the group—comprises the following steps:

a) activating all the access lines of the group;

b) receiving, via the memory's serial data input DI, a bit Ai of determined rank of the access line code to be selected;

c) and, depending on the value of the bit Ai received at the preceding step, deactivating a part of the other access lines, steps b) and c) being repeated p times successively, respectively for each of the bits of the line code of the access line to select (which are received in series via the memory's serial data input DI), so that at the end of these p iterations of steps b) and c), only the access line to select remains activated.

The way in which this technical effect is achieved shall now be described in more detail, by considering the example of the decoder of FIG. 3, in the particular case where p is equal to 3.

Regarding step a): this step is carried out by the transition to 1 of the RESET signal such as shown in the timing chart of FIG. 4b. The transistor N2 of each latch respectively 100 to 107 is made conducting by this RESET signal such that the input node H of each of the latches is brought to the ground's zero voltage potential. This provides that the output S of each of the latches is brought to the non-zero voltage potential V1, i.e. the access line respectively AL0 to AL7 is activated. Advantageously, as already mentioned above, all the access lines 100 to 107 are simultaneously activated at step a). This is simpler since one and the same signal RESET can produce this result.

Concerning step b): the bit Ai referred to above is one of the address bits A0 to A2 shown in the timing chart of FIG. 4a. It is recalled that these are the bits of the line access code to select. By convention, we shall consider that the bit A0 is received at the first iteration of step b), the bit A1 at the second iteration, and the bit A2 at the third iteration.

Concerning step c): It will be noted that before the first bits A0 to A2 are received, all the lines L1 to L6 are at logic 1 since the synchronization signals CK1, CK2 and CK3 are at zero. Thus the transistors M0 to M2 of each of the latches respectively 100 to 107 are conducting. Now, the transistor N2 of each of the latches respectively 100 to 107 is also conducting since, after step a), all the latches are activated. Therefore the decoding elements of each of the latches respectively 100 to 107 have the effect of imposing the ground's zero voltage potential at the input node H of each of the latches 100 to 107, the elements for imposing the non-zero voltage potential V2 on these nodes being deprived of effect owing to the high electrical resistivity of transistors P1 and P3. In other words, the decoding elements of the latches respectively 100 to 107 take the upper hand on the elements P1, P3 of each of the latches respectively. It will be noted that the fact that the signal RESET returns to zero is of little importance.

Let j be an index which identifies the $j^{th}$ iteration of step b) and step c). The bit received in series by the memory at this $j^{th}$ iteration of step b) is denoted $A_j$. The synchronization signal $CK_j$ is at logic 1 since it then presents a pulse. The output of one of the gates $NE_j$ or $NE_{j+3}$ which passes to zero depending on the value of bit $A_j$: if $A_j$ is at logic 1, then it is gate $NE_j$ which passes to zero; if $A_j$ is zero, then it is gate $NE_{j+3}$ that passes to zero. Accordingly, line $L_j$ or, respectively, line $L_{j+3}$ passes to zero such that the transistor $M_j$ of a part of the latches 100 to 107 becomes non conducting. The decoding elements of these latches are thus deprived of effect. Consequently, the elements P1, P3 for imposing a non-zero voltage potential on the input node H associated thereto can act. The input node H of these latches is thus brought to the non-zero voltage potential V2, which is indeed equivalent to saying that these latches are deactivated.

It will be noted that the access line(s) which is (are) deactivated at step c) is (are) the line(s) whose line code presents a bit of rank j of value different from that of bit $A_j$ received at the corresponding iteration of step b).

It will also be noted that in the case where the group of access lines comprises $2^p$ access lines, half the lines still activated is deactivated at each iteration of step c).

As already explained above in connection with the timing chart of FIG. 4a, the code bits of the access line to select which are received by the memory during the successive iterations of step b) are comprised in the address bits of a memory word of the memory on which must be effected an operation defined by an instruction received according to a given serial protocol.

FIG. 5 shows a diagram of a memory according to the invention. In this FIG., the same elements as in FIG. 1 have the same references. Only the differences shall be described in what follows.

The address bits received in series via the data input DI (through input buffer circuit INBUF as the case arises) are no longer sent to a shift register. On the contrary, they are sent directly partly to the line decoder ROWDEC and partly to the column decoder COLDEC. This is the reason why the decoder according to the invention does not comprise shift registers such as shift register AREG of FIG. 1, nor an address bus such as the ADDRESS_BUS of FIG. 1. Instead, it comprises elements having a unique address line ADDRESS_LINE to connect directly the data input DI to the word line decoder ROWDEC and/or the bit line decoder COLDEC, as the case arises through an input buffer circuit INBUF. From these differences, there results a notable correlative reduction in the area occupied by the memory on the doped silicon substrate.

There shall now be described a particular embodiment of the invention which allows a sequential addressing of the memory. By sequential addressing is understood the fact of selecting a memory word of the memory space not directly, by supplying its address, but by prior selection of all the words that precede it. This of course implies an ordered relation between the memory words. By extension, it is then necessary to proceed to a sequential selection of the memory access lines, which likewise supposes an ordered relation between the access lines.

In other terms, the invention also provides that the set of access lines being an ordered set, the selection process moreover comprises a step of activating the access line which, in the order of access lines, follows a determined access line which is selected, then a step of deactivating the determined access line, such that it is then the following access line which is selected.

In a simple example, the set of access lines is ordered by an increasing or decreasing order of binary values of line codes which are respectively associated thereto.

Figure 6:
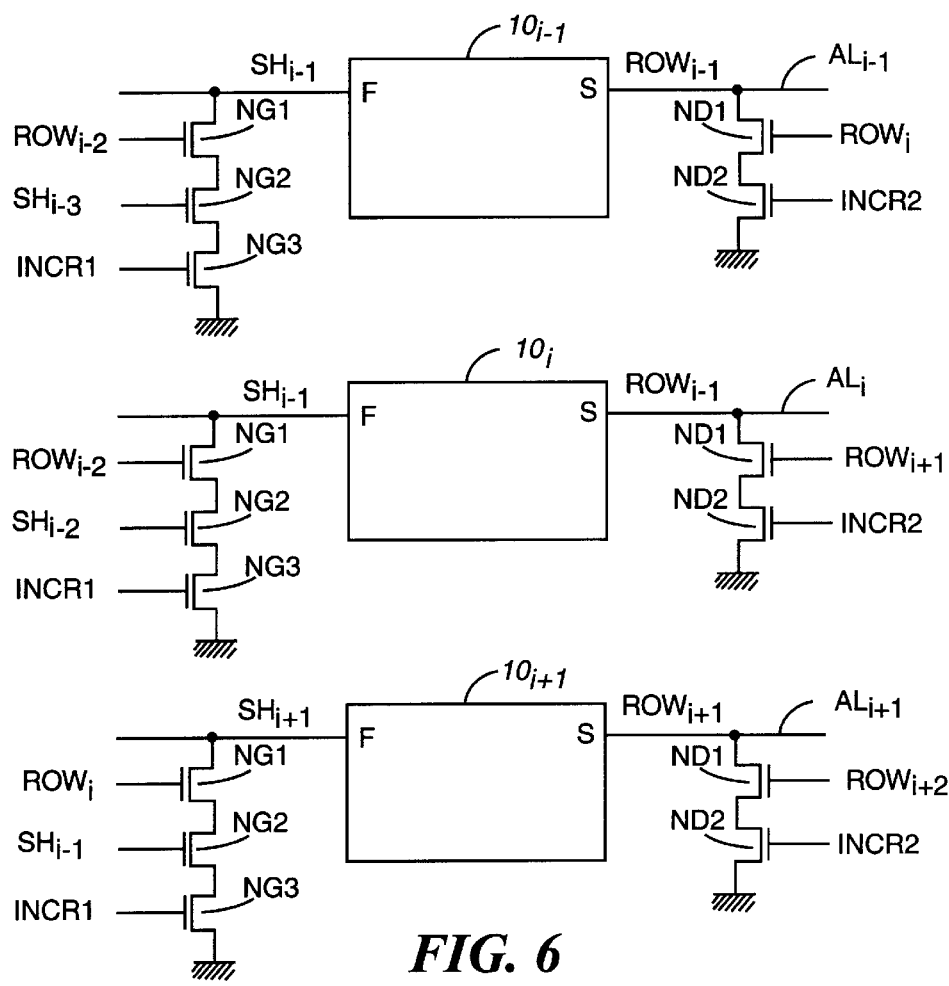
FIG. 6 is a diagram of an embodiment of the element of FIG. 3 used for sequentially selecting memory access lines, according to the present invention.

An access line decoder in accordance with this particular embodiment, shown partially in FIG. 6, comprises elements for activating the access line which, in the order of access lines, follows a determined access line which is selected, and elements for deactivating the determined access line so that it is then the following access line which is selected.

In FIG. 6, there is shown in simplified form three latches $10_{i-1}$, $10_i$ and $10_{i+1}$ coupled respectively to three access lines $AL_{i-1}$, $AL_i$ and $AL_{i+1}$ which follow each other in the order of the above-mentioned access lines. For simplification, only the outputs F and S of the latches are shown. We denote $ROW_i$ the signal delivered by the output S of latch $10_i$ and $SH_i$ the signal delivered by the output F of that latch. The signal $ROW_i$ is then at logic 1 when the access line $AL_i$ is activated and is at zero when that access line is deactivated. Note that the signal $SL_i$ is simply the inverse logic of the signal $ROW_i$.

The above-mentioned elements of the decoder comprise, for each latch, on the one hand three N-type MOS transistors referenced respectively NG1, NG2 and NG3, which are connected in series between the output F and ground, and on the other hand two N-type MOS transistors respectively designated ND1 and ND2 which are connected in series between the output S and ground.

For any given one of the latches, for example latch $10_i$ of index i, the gate of transistor NG1 receives the signal $ROW_{i-1}$, the gate of transistor NG2 receives the command signal $SH_{i-2}$, and the gate transistor NG3 receives a first command signal INCR1 while the gate of transistor ND1 receives the signal $ROW_{i+1}$, and the gate of transistor ND2 receives a second command signal INCR2. Naturally, for another latch $10_{i+k}$, either preceding or following, of arbitrary index i+k (with k positive or negative) the signal $ROW_{i-1}$, $SH_{i-2}$, and $ROW_{i+1}$ mentioned above are replaced by corresponding signals $ROW_{i+k-1}$, $SH_{i+k-2}$, and $ROW_{i+k+1}$.

In other words the three transistors NG1, NG2 and NG3 provide the combination of signals $ROW_{i-1}$, $SH_{i-2}$ and INCR1 in an AND-type logic operation, to impose the ground's zero voltage potential at the input node H of the latch, that is to activate the latch, when these three signals are simultaneously at logic 1. In yet other terms, these three transistors are elements controlled by the first command signal INCR1 to activate the access line associated to the latch when the preceding access line is activated and the one which precedes the latter is not activated. Conversely, the two transistors ND1 and ND2 produce the logical combination of signals $ROW_{i+1}$ and INCR2 in an AND-type operation, to impose the ground's zero voltage potential at the output S of the latch, that is to deactivate the latch, when these two signals are simultaneously at logic 1. In yet other terms, these two transistors are elements, controlled by the second control signal INCR2, for deactivating an access line associated to the latch when the following access line is activated.

The sequencing of the signals INCR1 and INCR2 enables to pass from the starting address to the desired ending address. FIGS. 7b and 7c show respectively the command signals INCR1 and INCR2 against the memory's clock signal CLK which is shown in FIG. 7a.

To explain the sequential selection of the memory access lines, it is necessary to consider as a starting address and the one in which only access line $AL_i$ is activated (i.e. in which line $AL_i$ is selected). The sequential selection consists in selecting the following line, that is line $AL_{i+1}$. The ending address is thus the one in which only the access line $AL_{i+1}$ is activated. There shall be described how, by virtue of the above-described elements, it is possible to achieve this result. As will have been understood, it is the sequencing of the signals INCR1 and INCR2 which makes it possible to pass from the starting address to the desired ending address.

At the starting address, the signals $ROW_j$ are at zero for all j not equal to i. Moreover, and correlatively, the signals $SH_j$ are at logic 1 for all j not equal to i. On the other hand, signal $ROW_i$ is at logic 1 and, correlatively, signal $SH_i$ is at zero. To reach the ending address, we proceed in two stages:

at a first stage, an INCR1 signal pulse is generated, for example on a clock signal pulse (see FIGS. 7a and 7b); the length of this pulse is at the most equal to one period of the clock signal; as the signals $ROW_i$ and $SH_{i-1}$ are at logic 1, the latch $10_{i+1}$ is activated, i.e. its access line $AL_{i+1}$ is activated; note that in addition to line $AL_i$ already activated, only that access line $AL_{i+1}$ is then activated; there thus remains to deactivate line $AL_i$ to obtain the desired result; this is what is done at a second stage;

indeed, at a second stage, there is generated an INCR1 signal pulse, for example during the following clock signal pulse CLK (see FIGS. 7a and 7c); the length of this pulse is at the most equal to one period of the clock signal; as the signal $ROW_{i+1}$ is at logic 1, the latch $10_i$ is deactivated, i.e. the access line $AL_i$ is deactivated; note that latch $10_{i+1}$ is not deactivated because the signal $ROW_{i+2}$ is at zero; note also that the signals $ROW_i$ and INCR2 being at logic 1, they tend to deactivate latch $10_{i-1}$ but it is observed that this without incidence since that latch was already in the deactivated state.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A method for selecting an access line to a matrix of memory cells with serial data access, one or more access lines selected from the group of access lines consisting of bit lines and word lines, the method comprising the steps of:

associating a line code to one or more access lines;

activating all the access lines of a group of access lines to a matrix of memory cells;

receiving, via a serial data input, a bit of determined rank of the access line to select; and deactivating one or more access lines as a function of the value of the bit received.

2. The method according to claim 1, where in the step of associating a line code includes associating a line code of p bits, and the method further comprising the step of:

repeating the steps of receiving and deactivating for p times successively, for each of the bits of the line code received via the serial data input to a matrix of memory cells, such that at the end of p iterations of the steps of receiving and deactivating, only the access line to be selected remains activated.

3. The method according to claim 1, wherein the step of deactivating one or more access lines includes deactivating one or more access lines as a function of the value of the bit (Ai), which the line code presents a bit of rank i of value different from that of the bit (Ai) received at the corresponding iteration of the receiving step.

4. The method according to claim 1, wherein the step of activating all the access lines includes activating all the access lines in the group comprising $2^p$ access lines, so that half the access lines still activated are deactivated at each iteration of the step of deactivating.

5. The method according to claim 2, wherein the step of activating all the access lines includes activating all the access lines in the group comprising $2^p$ access lines, so that half the access lines still activated are deactivated at each iteration of the step of deactivating.

6. The method according to claim 1, wherein the step of activating all the access lines includes activating all the access lines simultaneously.

7. The method according to claim 3, wherein the step of receiving, via a serial data imput, a bit (Ai) includes receiving a bit (Ai) to select one or more access lines of the matrix of memory cells forming a memory word of a given length.

8. The method according to claim 1, wherein the step of associating a line code includes associating a line code to one or more access lines comprising an ordered set, of access lines so that the step of deactivating includes deactivating one or more access lines comprising the order set.

9. The methods according to claim 1, wherein the step of associating a line code includes associating a line code to one or more access lines that form an ordered binary set of access lines.

10. A method for selecting an access line to a matrix of memory cells with serial data access, one or more access lines selected from the group of access lines consisting of bit lines and word lines, the method comprising the steps of:

a) associating a line code of p bits to one or more access lines forming a group (AL0–AL7);

b) activating all the access lines of the group (AL0–AL7);

c) receiving, via a serial data input (DI), a bit (Ai) of determined rank of the access line to select; and d) deactivating one or more access lines as a function of the value of the bit (Ai) received, which the line code presents a bit of rank i of value different from that of the bit (Ai) received; and e) repeating the steps c and d for p times successively, for each of the bits of the line code received via the serial data input to a matrix of memory cells, such that at the end of p iterations of the steps of c and d, only the access line to be selected remains activated.

11. An access line decoder for selecting an access line to a matrix of memory cells with serial data access, comprising:

one or more access lines selected from the group of access lines consisting of bit lines and word lines;

a plurality of latches, each coupled to one or more access lines, of a group of access lines, wherein a line code is associated to the one or more access lines, each latch comprising:

a switching element to impose a non-zero voltage potential on the access line when the latch is in an activated state and a zero voltage potential when the latch is in a deactivated state;

an activation element for setting the latch to the activated state; and a deactivation elements for setting the latch to a deactivated state as a function of the line code which is specific to one or more access lines and as a function of one or more selection signals received by the deactivation element;

means for setting all the latches to the activated state; and means for generating the one or more selection signals as a function of the line code received via a serial data to a matrix of memory cells.

12. The access line decoder, according to claim 11, wherein the switching element comprise an inverter whose input is connected to an input node of the latch and whose output is connected to an output of the latch, such that the inverter imposes a non-zero voltage potential when the voltage potential on the input node is zero and such that the inventor imposes a zero voltage potential on the output of the latch when the voltage potential at the input node of the latch is non-zero.

13. The access line decoder, according to claim 11, wherein the activation element comprises one or more decoding elements to impose a zero voltage potential on the input node of the latch.

14. The access line decoder, according to claims 13, further comprising an auxiliary means for imposing a non-zero voltage potential on said input node of the latch which act in the absence of action from the selection element.

15. The access line decoder according to claim 13, wherein the decoding elements comprise, in series between the input node of the latch and a ground, two or more transistors whose gates are connected to two or more selection inputs of the latch for receiving at least certain selection signals as well as another transistor whose gate is connected to an output of the latch.

16. The access line decoder according to claims 11, wherein the means for generating the selection signals comprise:
a first group of p NAND type logic gates (NE1–NE3) which, together, receive, at a first input, successively the p bits of the received line code, and which, each receive at a second input one among p synchronization signals presenting a pulse in phase respectively with $p^{th}$ bit of the line code received;
a second group of p NAND type logic gates (NE4–NE6) which together, receive on a first input, successively the inverse logic of the p bits of the received line code, and which each receive at a second input one among p synchronization signals presenting a pulse in phase, respectively, with the $p^{th}$ bit of the received line code.

17. The access line deconder according to any one of claim 11, wherein the one or more access lines comprising an ordered set, the latch further comprising:
means for activating the one or more access lines according to an order of the order set; and
wherein the deactivation element so includes a means for deactivating one or more access lines comprising the order set.

18. The access line decoder according to claim 17, wherein the means for activating the one or more access lines, according to an order of the order set, follows the one or more access lines selected, is selectively controlled by a command signal so that to activate a select access line in the one or more access lines is activated while an access line immediately preceding the select access line is not activated.

19. The access line decoder according to claim 17, wherein the deactivation element comprise a means, controlled by a second command signal (INCR2) for deactivating a select access line in the one or more access line while an access line immediately following the following an access line is activated.

20. The access line decoder according to claim 11, further comprising:
a matrix of memory accessible by a group of bit lines and a group of word lines; and
a bit line decoder.

21. The access line decode of claim 20, wherein the matrix of memory is EEPROM technology.

* * * * *

UNITED STATES PATENT AND TRADEMARK OFFICE
CERTIFICATE OF CORRECTION

PATENT NO.   : 6,324,117 B1
DATED        : November 27, 2001
INVENTOR(S)  : Zink et al.

Page 1 of 1

It is certified that error appears in the above-identified patent and that said Letters Patent is hereby corrected as shown below:

<u>Column 12,</u>
Line 12, from "imput" to -- input --
Line 57, from "elements" to -- element --

<u>Column 13,</u>
Lines 12 and 23, from "claims" to -- claim --

<u>Column 14,</u>
Line 4, from "deconder" to -- decoder --
Line 23, from "immediately following the following an" to -- immediately following an --
Line 30, from "decode" to -- decoder --

Signed and Sealed this

Nineteenth Day of March, 2002

Attest:

Attesting Officer

JAMES E. ROGAN
*Director of the United States Patent and Trademark Office*